United States Patent
Li et al.

(10) Patent No.: US 6,721,929 B2
(45) Date of Patent: Apr. 13, 2004

(54) HIGH ACCURACY TIMING MODEL FOR INTEGRATED CIRCUIT VERIFICATION

(75) Inventors: Jun Li, San Jose, CA (US); Hong Zhao, Fremont, CA (US); Hsien-Yen Chiu, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 63 days.

(21) Appl. No.: 09/854,146

(22) Filed: May 11, 2001

(65) Prior Publication Data

US 2002/0021135 A1 Feb. 21, 2002

Related U.S. Application Data (60) Provisional application No. 60/203,748, filed on May 12, 2000.

(51) Int. Cl.[7] .............................. G06F 17/50
(52) U.S. Cl. .................... 716/6; 716/4; 716/5
(58) Field of Search ................. 716/4, 5, 6

(56) References Cited

U.S. PATENT DOCUMENTS

| 5,675,502 A |   | 10/1997 | Cox |   |
|---|---|---|---|---|
| 5,841,672 A |   | 11/1998 | Spyrou et al. |   |
| 6,047,247 A | * | 4/2000 | Iwanishi et al. | 702/117 |
| 6,269,467 B1 | * | 7/2001 | Chang et al. | 716/1 |
| 6,314,546 B1 | * | 11/2001 | Muddu | 716/5 |
| 6,476,635 B1 | * | 11/2002 | Rahim et al. | 326/41 |

OTHER PUBLICATIONS

Shepard, KL: "Practical Issues of Interconnect Analysis in Deep Submicron Integrated Circuits", Proceeding International Conference on Computer Design VLSI in Computers and Processors, Austin, TX, Oct. 12–15, 1997pp. 532–541.

Kahng A B et al.: "Efficient gate Delay Modeling for Large Interconnect Loads", Multi–Chip Module Conference, 1996, MCMC–96, Proceedings, 1996 IEEE Santa Cruz, CA, Feb. 6–7, 1996, pp. 202–207.

\* cited by examiner

*Primary Examiner*—Vuthe Siek
(74) *Attorney, Agent, or Firm*—Stattler Johansen & Adeli, LLP (57) ABSTRACT

A variable current source model accurately determines timing delays for designs of circuits implemented in integrated circuits. A design for an integrated circuit specifies a resistive-capacitive ("RC") network. The RC network couples a driving point and a receiving point, and a circuit specified in the design, drives the RC network at the driving point. The variable current source model determines driving currents for the circuit at the driving point based on the RC network and a characterization model of the circuit. A timing delay between the driving point and the receiving point is determined by simulating the drive of the RC network with the driving current at the driving point.

25 Claims, 8 Drawing Sheets

HIGH ACCURACY TIMING MODEL FOR INTEGRATED CIRCUIT VERIFICATION

CROSS-REFERENCES TO RELATED APPLICATIONS

This application claims the benefit of U.S. Provisional Patent Application No. 60/203,748, filed May 12, 2000, entitled "High Accuracy Timing Model for Timing/Power Verification."

BACKGROUND OF THE INVENTION

FIELD OF THE INVENTION

The present invention is directed toward the field of electronic design automation ("EDA") tools, and more particularly to timing and verification techniques using a variable current source.

ART BACKGROUND

One aspect of integrated circuit design involves determining timing parameters and power consumption to characterize the chip. Currently, large scale integrated circuit ("LSI") and very large scale integrated circuit ("VLSI") designs are transitioning from deep submicron to ultra deep submicron ("DSM/UDSM") feature sizes. With this transition, timing and power verification becomes more critical to achieve high electrical performance with complex integrated circuit designs. In addition to feature sizes, the accuracy of timing and power verification is also critical due to the ever-increasing size of integrated circuit designs. Furthermore, fast and accurate power and timing verification techniques are critical to meet the time to market product window demands on today's integrated circuit designs.

In general, the timing parameters define how signals propagate from one section of the chip to another. For example, timing parameters define rising signal and falling signal propagation times from drive circuits to receiver circuits in LSI/VLSI circuits. Currently, timing and power information is generated based on an instance based delay and power calculation. The delay and power calculation is formulated from a fixed library. Specifically, the library defines the pin-to-pin delay and output rise and fall times from a fixed reference lookup table of input signal slew rates and output loading capacitances. Using a fixed base library, output rise and fall times are specified based on input signal slew rates and fixed output loading capacitances.

To generate the library for timing verification, a load capacitance and input signal slew rate are used to derive the change of output voltage from the change of input voltage. However, this simple technique does not account for circuit level and device level non-linear characteristics. To further simplify the analytical requirements, the output signal curve of a device is specified as a linear sweep. With the continuing rapid advances in lithography, and as transistor dimensions become smaller, this output signal curve is dominated to a much larger extent by the transistors' nonlinear region of operation.

This prior art technique causes errors in computing both the driving instance delay and the RC network propagation delay. Specifically, these prior art linear sweep techniques cannot match actual signal curves for circuits and thus introduce unacceptable error for the delay calculation. For example, the linear sweep technique does not account for resistive shielding effects. The resistive shielding effects are caused by the resistive element in the RC network. These resistive shielding effects are amplified in DSM/UDSM designs. Thus, using these linear sweep techniques, the actual signal delay may be significantly different then the delay predictions. Accordingly, a new driving methodology is required to properly calculate delay and power results that accurately reflect the nonlinear behavior particularly found in DSM/UDSM designs.

In the DSM/UDSM designs, modeling the circuits output strength based on the change of the circuit's output voltage is critical to correctly calculating timing delay parameters and power consumption. Because traditional linear voltage sweep techniques cannot match the actual signal curves and circuits, and thus introduce unacceptable error for delay and power calculations, there is a need to more accurately model circuit characteristics based on the change of the output (driving) voltage.

SUMMARY OF THE INVENTION

A variable current source model accurately determines timing delays for designs of circuits implemented in integrated circuits. A design for an integrated circuit specifies a resistive-capacitive ("RC") network, such as a wiring network that interconnects circuits in an integrated circuit. The RC network couples a driving point and a receiving point. A circuit specified in the design, such as a gate level circuit implemented in a standard cell, drives the RC network at the driving point. The variable current source model determines driving currents for the circuit at the driving point based on the RC network and a characterization of the circuit. A timing delay between the driving point and the receiving point is determined by simulating the drive of the RC network with the driving current at the driving point.

In one embodiment, the variable current source model operates as follows. A plurality of time instances, which correspond to a plurality of output voltages to the circuit, are specified. An initial drive current is selected, and a drive voltage, corresponding to the drive current, is determined by simulating the driving of the RC network at the driving point with the initial drive current. A load capacitance for the circuit is dynamically determined. In one embodiment, the load capacitance is determined from the charging and discharging of the RC network from the drive current. For each time instance, a new drive current for the circuit is determined from the drive voltage and the load capacitance from the previous time instance. A receiving voltage for each time instance is determined from the drive voltage and a transfer function for the RC network. The drive voltages and receiving voltages are used to generate the timing parameters of the RC network.

In one embodiment, a circuit characterization model is generated to determine, for each time instance, a new drive current from the drive voltage and the load capacitance from a prior time instance. The circuit characterization model depicts relationships among input signal slew rates, load capacitances, drive currents and drive voltages for the circuit. In one embodiment, the model is accessed to extract a drive current based on the drive voltage, effective capacitance, and the input signal slew rate selected.

The variable current model has application for calculating power, including peak power, as well as analyzing cross talk and IR drop.

DETAILED DESCRIPTION

The disclosure of U.S. Provisional Patent Application No. 60/203,748, filed May 12, 2000, entitled "High Accuracy Timing Model for Timing/Power Verification" is hereby expressly incorporated herein by reference.

Timing Parameters Calculation

Figure 1:
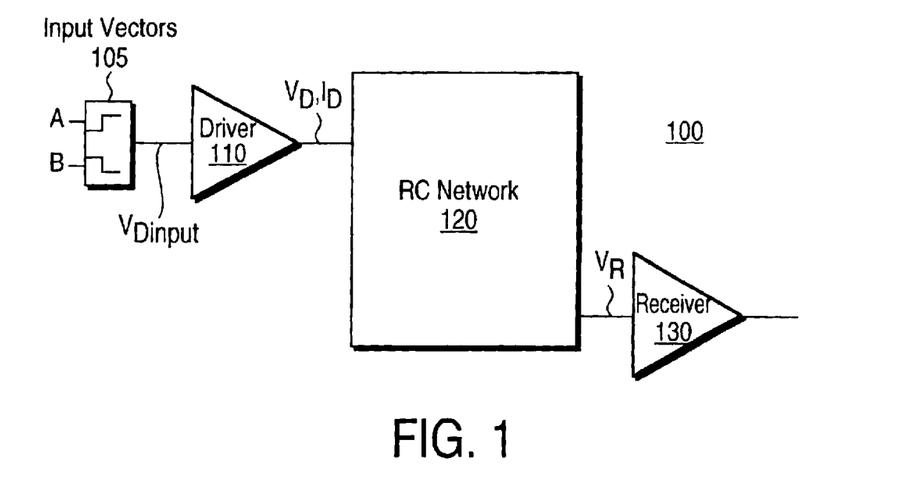
FIG. 1 illustrates one embodiment for characterizing the timing parameters of a circuit.

FIG. 1 illustrates one embodiment for characterizing the timing parameters of a circuit. The circuit includes a driver circuit 110 and a receiver 130, interconnected by a resistive-capacitive ("RC") network 120. In one embodiment, the RC network comprises interconnect lines, consisting of metal or polysilicon, deposited on one or more layers of an integrated circuit. The driver 110 is intended to represent a broad category of circuits that provide driving sources (e.g., charging/discharging paths) at an output stage. Similarly, the receiver 130 is intended to represent a broad category of circuits that receive the signals and propagate them through circuits (e.g., logic gates).

In one embodiment for defining timing parameters, the delay of the circuit includes both the driving instance delay and the RC network propagation delay. As used herein, the driving instance delay is the timing delay exhibited by a circuit (e.g., driver 110), and is measured as the time difference between the input of a signal to a circuit and the output of the circuit in response to that input. As used herein, the RC network propagation delay is defined as the signal delay measured from the output voltage of a circuit driver (e.g., driver 110) and the input voltage of a receiver (e.g., receiver 130) as propagated through a wiring interconnect network (e.g., RC network 120).

The voltage signals input to a circuit are characterized by input signal slew rate. In general, the input signal slew rate measures the rate at which the voltage rises from 10% of $V_{dd}$ to 90% of $V_{dd}$ or falls from 90% of $V_{dd}$ to 10% of $V_{dd}$. For the example in FIG. 1, the driving instance delay is the time delay exhibited by driver 110 to propagate a signal as measured by the time difference required to generate a voltage, $V_d$, at the output of driver 110 from an input voltage in input vector 105. The gate level circuit (e.g., driver 110) may include one or more inputs. The input vectors represent the combinations of different inputs states. The example of FIG. 1 has only one input signal that transitions from 0 to 1 or from 1 to 0, thereby causing the output signal to switch from 1 to 0 or 0 to 1, respectively. For the simplified driver circuit of FIG. 1, which includes only one input, input vectors 105 include one input waveform that transitions from a low logic level to a high logic level, and a second input vector that transitions from a high logic level to a low logic level. As described below in conjunction with FIG. 2, the circuit may include multiple inputs, and the input vectors may include different combinations of signal transitions for the multiple inputs.

The signals in the input vectors 105 are characterized, in part, by input signal slew rates. In one embodiment, the signals of input vectors 105 drive the driver circuit 110 with one or more predefined input signal slew rates. Those input signal slew rates are typically generated from the output stage of another circuit that drives driver circuit 110.

Figure 2:
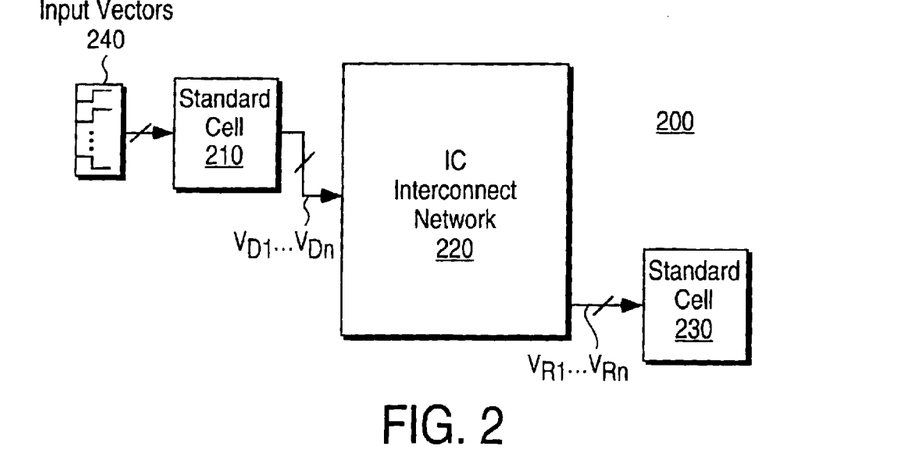
FIG. 2 illustrates another embodiment for characterizing timing parameters in an integrated circuit.

FIG. 2 illustrates another embodiment for characterizing timing parameters in an integrated circuit. A circuit 200 includes a standard cell 210 coupled to a standard cell 230 through IC interconnect network 220. The IC interconnect network consists of wires deposited on one or more metal or polysilicon layers of an integrated circuit. The standard cells (210 and 230) implement one or more "gate level circuits." As is well known, the "gate level circuits" may include circuits that employ buffers, memory, logic gates, flip-flops, clock circuits, etc. As shown in FIG. 2, input vectors 240 are input to standard cell 210 to drive the one or more logic circuits implemented in the standard cell. Although shown in FIG. 2 as a single combination, the input vector 240 includes a "series" of input signal combinations for the logic circuits, as appropriate. Also, the circuit may be characterized with multiple input vectors, such that different input vectors have different input signal slew rates. The driving instance delay for standard cell 210 is measured from the voltage signals of the input vectors 240 that drive the standard cell 210 to the output drive voltages, labeled $V_{d1} \ldots V_{dn}$ on FIG. 2. The RC network propagation delay for circuit 200 is measured from the output drive voltages, $V_{d1} \ldots V_{dn}$, which drive the IC interconnect network 220, to the input receiver voltages, $V_{d1} \ldots V_{rn}$ of the standard cell 230. In one embodiment, the EDA software generates timing parameters for an integrated circuit on a "net" by "net" basis. The circuit 200 of FIG. 2 depicts a single net.

Variable Current Source Model

The present invention utilizes a variable current source to determine timing and power parameters. The effective current, output from a circuit under analysis, is determined for multiple time intervals. In turn, this effective current is used to drive the RC network at each time instance. The response of the RC network for a given current, $I_{eff}$, gives the voltage changing at the driver point, which, in turn, yields a new effective capacitance for the RC network at each time interval. Based on the new effective capacitance and voltage at the driver point, a new effective current is determined and applied to the RC network. As described more fully below, the current, which varies at each time interval, drives the RC network and affects the equivalence capacitance of the RC network as seen from the driving point. For purposes of nomenclature, the term "dynamic capacitance" refers to the equivalent capacitance of the RC network at each time interval (i.e., the capacitance is dynamic because it changes based on the current charging and discharging of the RC network and the voltage changing at the driving point of the RC network). For the example of FIG. 1, the effective current, $I_d$, is computed for the driver circuit 110 at each time interval. In turn, this effective current is used to drive the RC network at each time instance, and an effective capacitance is calculated at each time instance.

Figure 3A:
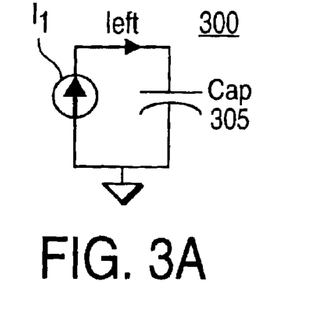
FIG. 3A illustrates a circuit that models the variable current source at a first time instance.

FIG. 3A illustrates a circuit that models the variable current source at a first time instance. At shown in FIG. 3A, a first current, $I_1$, for circuit 300 generates an effective current, $I_{eff}$, for a capacitance 305. The capacitance 305 represents the equivalent capacitance of an RC network (e.g., interconnect network in an integrated circuit). The first current, $I_1$, represents the current at a first time instance. In one embodiment, the current, $I_1$, is determined by characterizing a driver circuit. For example, the current, $I_1$, may be characterized based on an input voltage to the driver circuit.

Figure 3B:
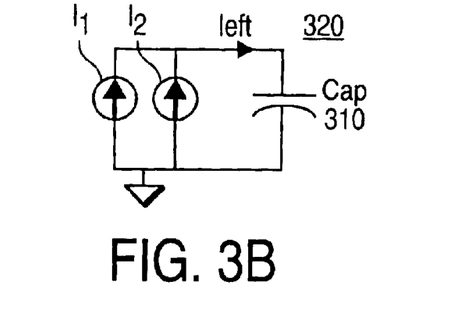
FIG. 3B illustrates a circuit that models the variable current source at a second time instance.
Figure 3C:
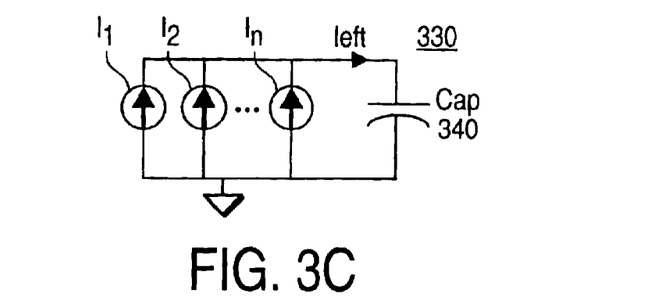
FIG. 3C illustrates a circuit that models the variable current source at time instance "n."

FIG. 3B illustrates a circuit that models the variable current source at a second time instance. At shown in FIG. 3B, a second current, $I_2$, for circuit 320 and the first current, $I_1$, are combined to generate an effective current, $I_{eff}$, for a capacitance 310. The second current, $I_2$, reflects the changing of the current applied to the RC network at the second time instance. FIG. 3C illustrates a circuit that models the variable current source at time instance "n." For time instance "n", the effective current is a sum of the previous currents, $I_1$ to $I_{(n-1)}$, applied to the RC network at each time instance to generate a new effective current, $I_{eff}$. One or more of the current may be a negative current (i.e., current flowing in the opposite direction). The new effective current is applied to the new capacitance 340, and voltage at the driving point is calculated based on the current applied to the RC network and the impedance.

As illustrated in the example of FIGS. 3A–C, the iterative technique of calculating current based on the voltage, and thus the changing capacitance, at multiple time instances for a circuit under analysis may be modeled as a variable current source. The variable current source of the present invention accounts for the true behavior of a driver circuit under analysis by considering the non-linear voltage-current (V-I) characteristics of the switching transistors of the circuit. Thus, the variable current source technique accurately captures the resistive shielding of the RC network.

Circuit Model Characterization

Figure 4:
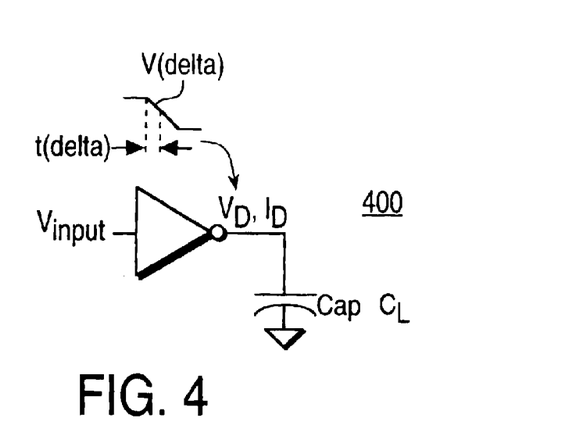
FIG. 4 illustrates an example driver circuit for circuit characterization of the present invention.

The techniques of the present invention characterize the voltage and current (V-I) characteristics of driver circuits based on the input signal slew rates and the load capacitances. FIG. 4 illustrates an example driver circuit for circuit characterization of the present invention. A driver circuit (inverter) 400 receives, as input, a voltage, $V_{input}$, and generates, as an output, drive voltage, $V_d$, and drive current, $I_d$. Also as shown in FIG. 4, the drive voltage, $V_d$, and drive current, $I_d$, drive a capacitive load, $C_L$. The input voltage, $V_{input}$, exhibits an input signal slew rate. For the example input voltage of FIG. 4, the input signal slew rate is the rate the voltage transitions from a high logic level to a low logic level (e.g., 90% to 10% of $V_{dd}$).

In one embodiment, the output voltage, $V_D$, is divided into discrete time instances in order to characterize the inverter circuit 400. Specifically, a time difference, referred to as t(delta), is specified to define the time between a plurality of time instances for characterization of the circuit. For example, multiple time instances may be defined for the circuit output voltage, $V_D$, with the granularity of t(delta), as it transitions from 0 to $V_{dd}$. FIG. 4 also shows a change in voltage, V(delta), for the elapsed time, t(delta), for the circuit output voltage, $V_D$.

Figure 5:
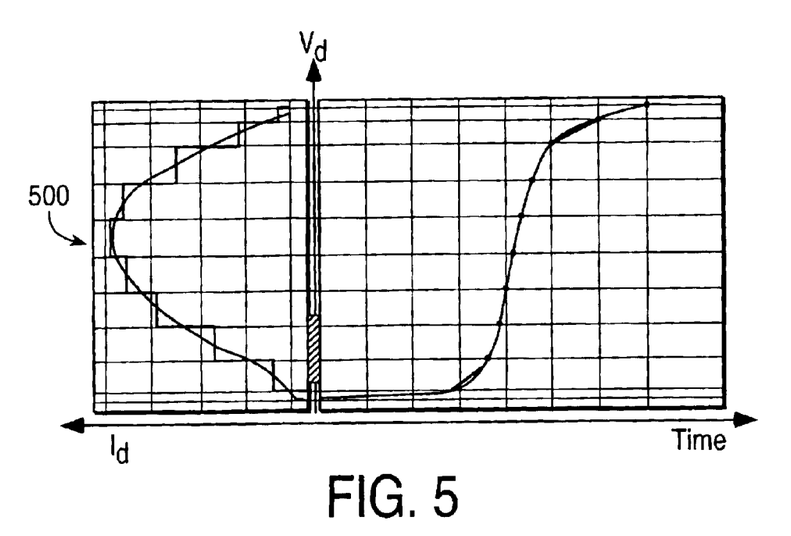
FIG. 5 illustrates a V-I curve for an example gate level circuit.

In one embodiment, the EDA software conducts an analysis on gate level circuits (e.g., inverter 400) in order to characterize the circuit for use in timing and power calculations. Specifically, output voltage verses current characterization is defined for multiple input slew rates for input voltages, $V_{input}$, and multiple load capacitances, $C_L$. FIG. 5 illustrates a V-I curve for an example gate level circuit. The vertical axis plots voltage, $V_d$, and the horizontal axis, extending to the left, plots current, $I_d$. As shown by the example plot in FIG. 5, as the voltage, $V_d$ increases from 0 volts, the current increases to a point, label 500 in FIG. 5. At point 500, the current begins to decrease as the voltage increases. FIG. 5 also plots the voltage, $V_d$, with respect to time.

Figure 6:
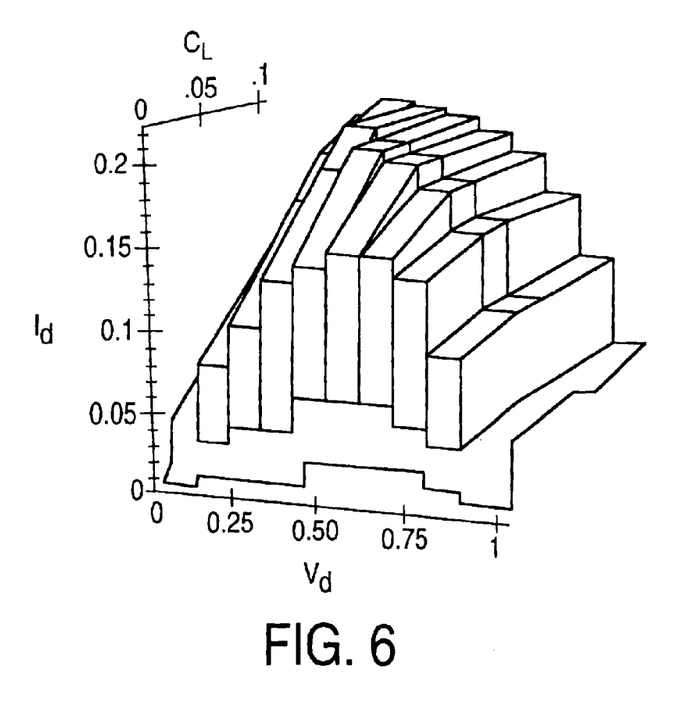
FIG. 6 illustrates a three dimensional graph that depicts the relationship between driver voltage, $V_d$, driver current, $I_d$, and load capacitance, $C_L$.

FIG. 6 illustrates a three dimensional graph that depicts the relationship between voltage, $V_d$, current, $I_d$, and load capacitance, $C_L$. As shown in the three dimensional graph of FIG. 6, the current, $I_d$, is dependent upon both the voltage, $V_d$, and the load capacitance, $C_L$. In addition, the current, $I_d$, voltage, $V_d$, and the load capacitance, $C_L$ are dependent upon input signal slew rates (not shown). In one embodiment, the data depicted in FIG. 6 is generated for multiple signal slew rates. The data depicted in FIG. 6 is referred to herein as the "Circuit Model Characterization Data." The Circuit Model Characterization Data for multiple signal slew rates is referred to herein as a library of the Circuit Model Characterization Data. The EDA software of the present invention generates Circuit Model Characterization Data for each input to output pin pairs for gate level circuits employed in an IC design under analysis.

In one embodiment, the EDA software utilizes SPICE or HSPICE to generate the Circuit Model Characterization Data. For this embodiment, the gate level circuit is simulated, using HSPICE software, to generate the V-I relationships for multiple input signal slew rates and multiple load capacitances. Although the present invention is described using HSPICE to generate the Circuit Model Characterization Data, any circuit simulation technique may be used without deviating from the spirit or scope of the invention.

Numerical Analysis for Computing Voltage, Current & Effective Capacitance

Figure 7:
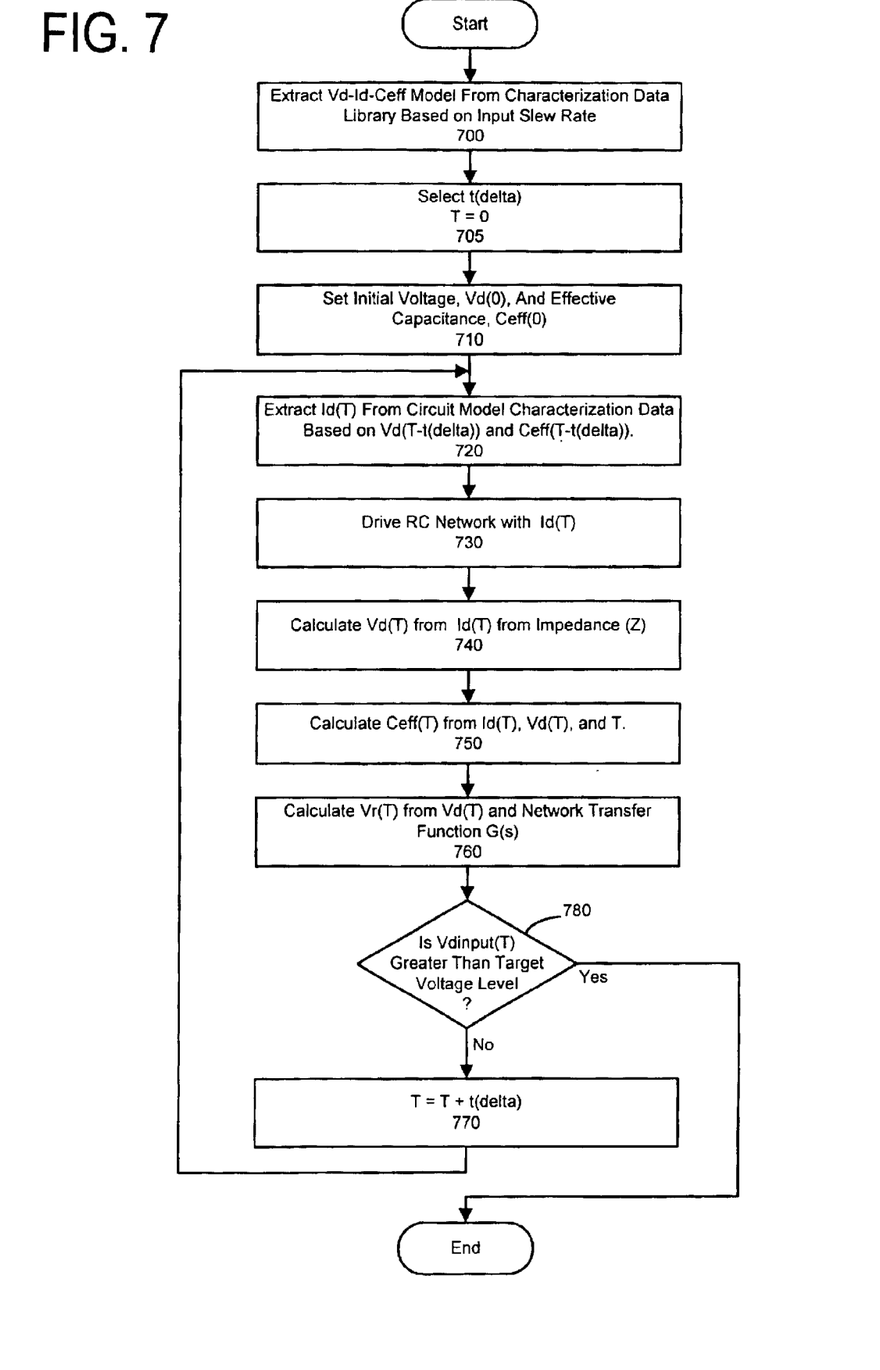
FIG. 7 is a flow diagram illustrating one embodiment for generating timing parameters using the current based model of the present invention.

FIG. 7 is a flow diagram illustrating one embodiment for generating timing parameters using the variable current source model of the present invention. The circuit under analysis is characterized, so as to extract the voltage-current (V-I) characteristics for the circuit based on an input slew rate (block 700, FIG. 7). In one embodiment, the input slew rate is defined from the previous net calculation for a "net" that drives the circuit under operation. A granularity of time, t(delta), is selected to execute the process, and the time, T, is set to zero (block 705, FIG. 2). The process is initialized by setting the voltage, $V_d(0)$ and the effective capacitance, $C_{eff}(0)$, to extract an initial current for the iterative process (block 710, FIG. 7). A current, $I_d(T)$, is extracted from the circuit model characterization data based on the voltage, Vd(T-t(delta)), and the effective capacitance, Ceff(T-t(delta)) (block 720, FIG. 7). For the first iteration, the current, $I_d(T)$, is extracted based on the initial voltage, $V_d(0)$ and initial effective capacitance, $C_{eff}(0)$. As discussed above, the circuit model characterization data identifies a current, $I_d$, for a corresponding $V_d$, $C_{eff}$, and input signal slew rate for the circuit under analysis.

The RC network under analysis is reduced for computation purposes. In one embodiment, the RC network is reduced to a network response function (e.g., transfer function) representation, G(s), for the corresponding RC network. Also, the impedance of RC network at the driving point, Z(s), is computed. The RC network response at the driving point is described more fully below in conjunction with a discussion of FIG. 8, and the RC network response at the receiver point is described more fully below in conjunction with a discussion of FIG. 9. The new current, $I_d(T)$, for the new time instance, T, is applied to drive the RC network (block 720, FIG. 7). From the RC network impedance at the driving point, Z(s), the $V_d$, for time T, is computed using the $I_d$ for time T as follows:

$$Vd(s)=I(s)*Z(s)$$

(block 740, FIG. 7). From the new voltage, $V_d$, for the time instance at time T, the process calculates an effective capacitance, $C_{eff}(T)$, using the current, $I_d(T)$, the voltage, $V_d(T)$ and the time of the instance, T (block 750, FIG. 7). Specifically, the effective capacitance, $C_{eff}(T)$, is calculated from the expression:

$$Id(T)=Vd(T)*Ceff(T)/T$$

$$Ceff(T)=Id(T)*T/Vd(T)$$

The new effective capacitance Ceff(T), combined with the voltage, Vd, at the driving point, affects the new effective driving current. The calculated voltage at the driving point of the RC network is applied to the network transfer function, G(s). Specifically, to calculate the timing delay (i.e., RC network propagation delay) for the circuit and RC network under analysis, the voltage at the receiver, $V_r(T)$, is calculated from the voltage at the driver output, $V_d(T)$, using the RC transfer function G(s) as follows:

$$Vr(T)=Vd(T)*G(s)$$

(block 760, FIG. 7).

The process is repeated using the new current to drive the RC network to obtain a new voltage and a new effective capacitance. If the driver output voltage, $V_d$, for the next time instance, T, is greater than the target voltage level (e.g., Vdd/2), then the process is complete (i.e., all the necessary parameters have been calculated to compute the timing delay and power consumption) (block 780, FIG. 7). Alternatively, if the driver voltage, $V_d$, for the next time instance, T, is less than or equal to the target voltage level (e.g., Vdd/2), then the process calculates a new time from the relationship T=T+t(delta), where T is the time accumulated for the time instance, and t(delta) is the time increment for the process. The process begins the next cycle by extracting, from the circuit model characterization data, a new $I_d(T)$ based on the drive voltage and effective capacitance from the previous cycle (i.e., $V_d$(T-t(delta)) and $C_{eff}$(T-t(delta)) (block 720, FIG. 7). With the new current, $I_d(T)$, a new drive voltage, $V_d(T)$, is calculated (block 740, FIG. 7); a new effective capacitance, $C_{eff}(T)$, is calculated (block 750, FIG. 7); and a new receiver voltage, $V_r(T)$, is calculated (block 760, FIG. 7).

The process of FIG. 7, which includes, for each iteration, extracting current based on voltage and capacitance for an input signal slew rate, results in an operating curve for the gate level circuit and RC network under test. For example, FIG. 6 depicts the relationships between $V_d$, $I_d$ and $C_L$ for an input signal slew rate. Using this Circuit Model Characterization Data, the process of FIG. 7 selects points on the V-I-C coordinates to characterize the operation of the gate level circuit driving the RC network.

Figure 8:
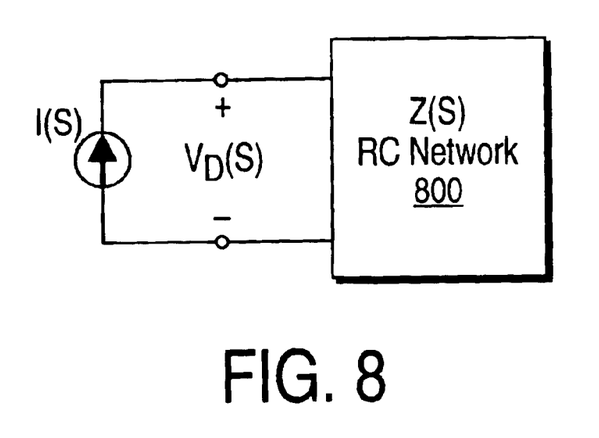
FIG. 8 illustrates a drivability RC network for use in the determining the timing parameters of the present invention.

FIG. 8 illustrates an RC network impedance for use in determining the timing parameters of the present invention. The RC network impedance 800 is reduced to the function Z(s). Specifically, the function Z(s) is the impedance, both real and complex, as seen from the input of the RC network. As shown in FIG. 8, the voltage, $V_d(s)$, is measured from the driving point of the RC network, and the current $I_d(s)$, is measured as the current flowing into the input of the RC network.

Figure 9:
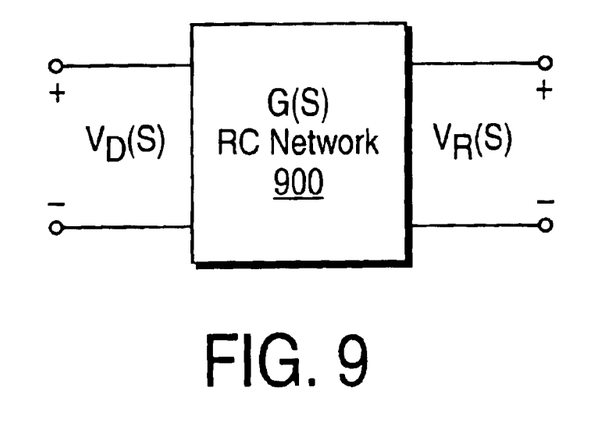
FIG. 9 illustrates an RC network transfer function for use in the determining the timing parameters of the present invention.

FIG. 9 illustrates an RC network transfer function for use in determining the timing parameters of the present invention. The RC network transfer function 900 is reduced to a transfer or response function, G(s). The G(s) represents the voltage propagation through the resistance, capacitance and inductance of the RC network. Specifically, the transfer function, G(s), defines the output voltage, Vr(s), based on the input voltage, Vd(s), for a specified time, T.

Dynamic Capacitance

The techniques of the present invention capture "dynamic capacitances" as the variable current source charges the RC network. In one embodiment, the dynamic capacitance may be calculated for each time instance (i.e., each stage of the iterative process). The dynamic capacitance, $C_d$, may be defined by the expression:

$$C_d=(\Sigma I_i * T_i)/V,$$

Where, $C_d$ is the dynamic capacitance, $I_i$ is the driver current in each step, $T_i$ is the time in each step, and V is the voltage.

Timing Delay Calculations

The variable current source technique has applications for calculating timing delay. For the embodiment of FIG. 7, the receiver voltage, $V_r(n)$, is calculated for each step. To calculate the timing delay, including the driving instance delay and the RC network propagation delay, the time difference between the input voltage to the gate level circuit (e.g., $V_{input}$ in FIG. 4) and the input voltage to the receiver, Vr, is computed. In this manner, a timing delay calculation is determined for each net based on the time difference between the input set of vectors to the gate level circuits and the corresponding input sets of voltages at the receiver.

Power Calculation

The present invention has application for calculating power consumption in an IC design. As discussed above, instantaneous current change is calculated for a design. Using the instantaneous current change, power consumed in the IC may be estimated. For example, average current, $I_{avg}$, is calculated as follows:

$$I_{avg}=\frac{1}{2}*C*V^2*f$$

The average power, $P_{avg}$, is calculated from the average current, $I_{avg}$, as follows:

$$P_{avg}=I_{avg}*V$$

The peak power is calculated based on maximum current as follows:

$$P_{peak}=I_{max}*V$$

Where, $P_{peak}$ connotes peak power, $I_{max}$ connotes maximum peak to peak current in the design, and V connotes the voltage in the RC network.

Cross Talk & IR Drop Analysis

The present invention also has application for use in cross talk and IR drop analysis. In one embodiment, the EDA software stores information regarding mutual capacitance in a database. Using the current source model of the present invention, the change in current, to either charge or discharge the RC network, is simulated to drive the aggressor net (i.e., the source net for the crosstalk energy) and the victim net (i.e., the net receiving the crosstalk energy from the aggressor net). Using the current source model, delay due to the effects of mutual capacitance, or cross talk, is estimated easily and accurately for different cases.

Figure 10A:
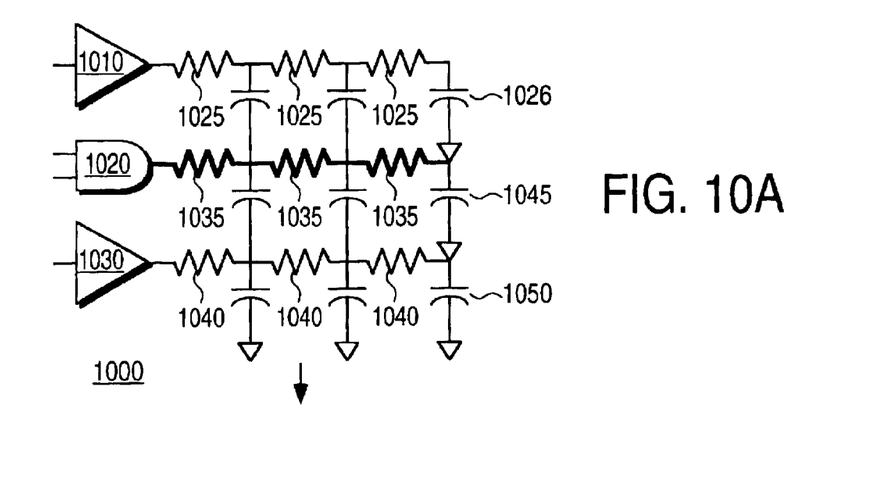
FIG. 10A illustrates an example circuit for cross talk analysis from the driver circuits.
Figure 10B:
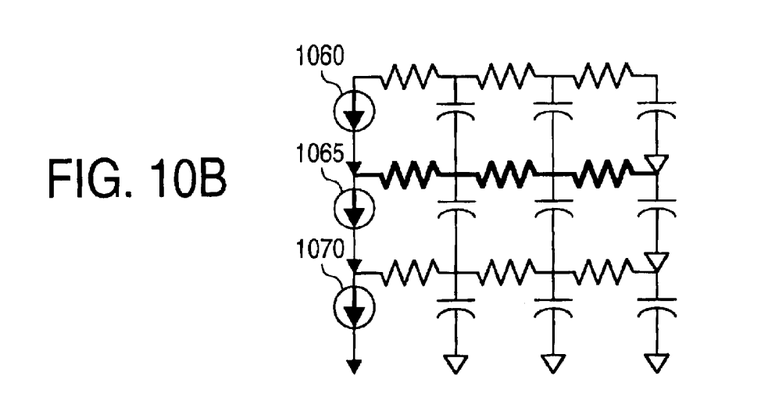
FIG. 10B illustrates modeling gate level circuits with current sources for cross talk analysis.
Figure 10C:
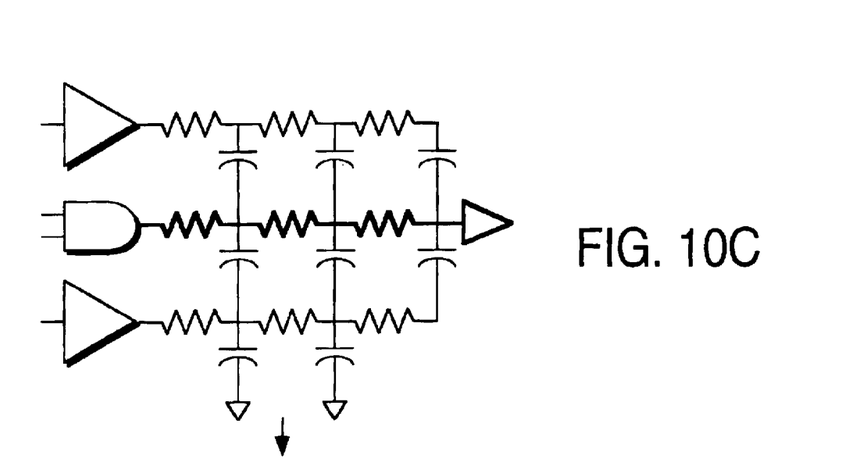
FIG. 10C illustrates an example circuit for cross talk analysis from the receiver circuits.
Figure 10D:
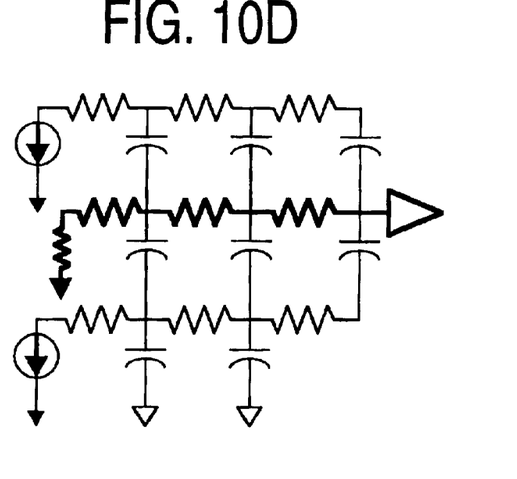
FIG. 10D illustrates modeling gate level circuits with current sources for cross talk analysis.

FIG. 10A illustrates an example circuit for cross talk analysis from the driver circuits. Using the variable current source techniques of the present invention to simulate current for the gate level circuits, the example circuit of FIG. 10A is simulated as the example circuit of FIG. 10B. Specifically, in FIG. 10B, the gates level circuits 1010, 1020 and 1030 are replaced with current sources 1060, 1065, and 1070, respectively. FIG. 10C illustrates an example circuit for cross talk analysis from the receiver circuits. The variable current source techniques are used to simulate current for the gate level circuits for driving a receiver as shown in FIG. 10D. Using the peak-to-peak current value, the noise influence on victim nets is estimated from the total coupling capacitance and the peak current within the signal switch period.

Figure 11:
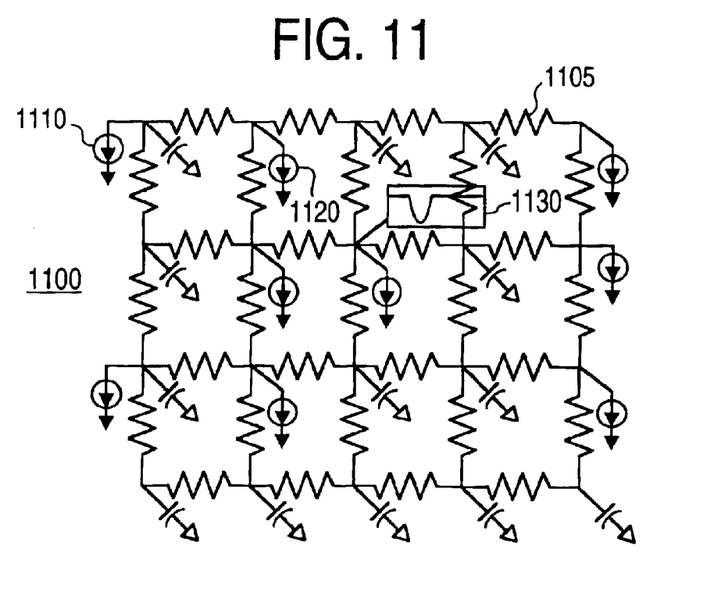
FIG. 11 illustrates a circuit model for IR drop analysis.

The variable current source techniques of the present invention have application for IR drop analysis. Using the driving point current change result, a linear network model is built with resistance and capacitance mesh and sets of variable current sources. For this embodiment, the linear circuit is used in the high level (full chip) IR drop analysis. By adding an instance on the resistive mesh of the power net, the peak drop is estimated from the peak current and total resistance, so the overall drop distribution is drawn easily and accurately. FIG. 11 illustrates a circuit model for IR drop analysis.

Computer System

Figure 12:
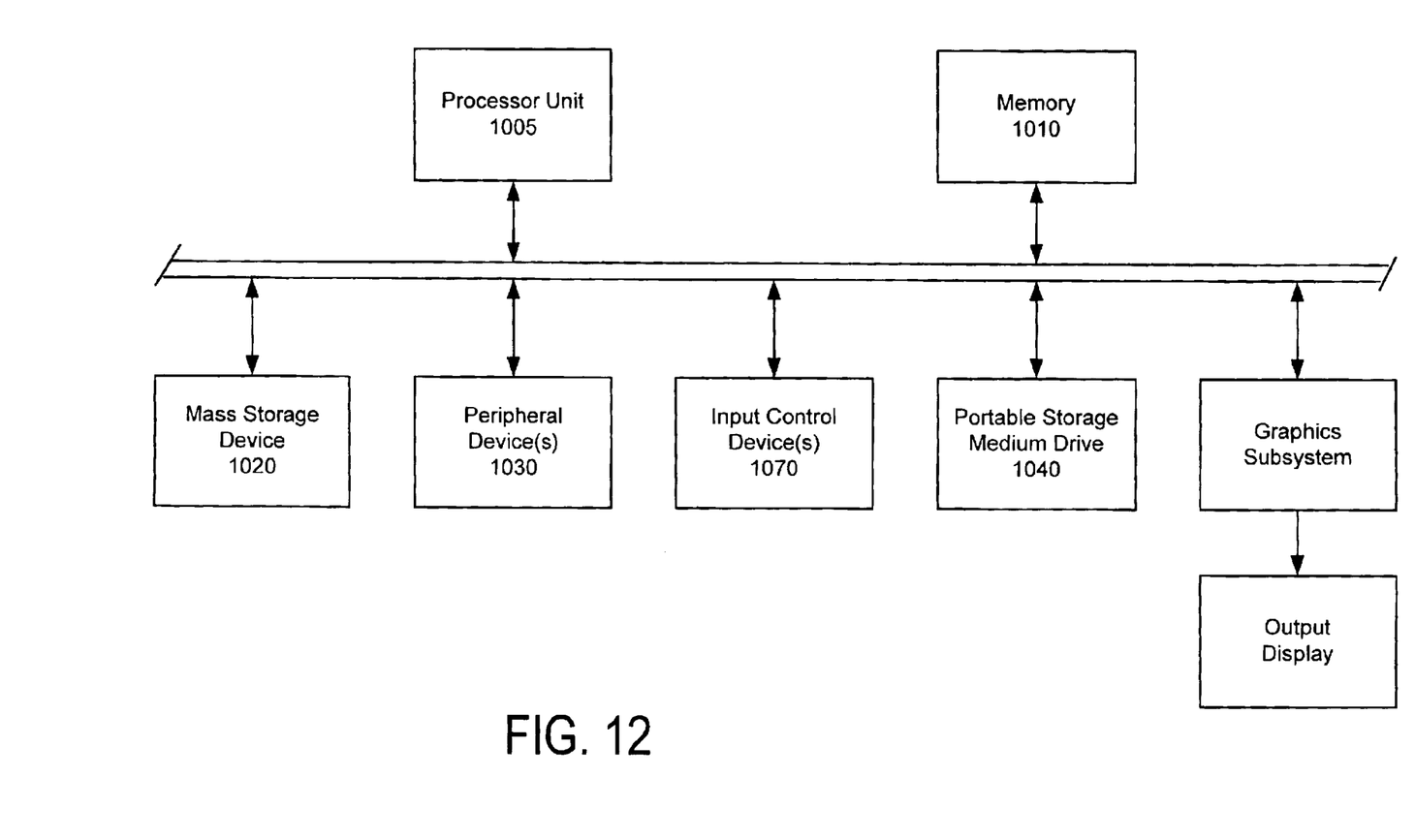
FIG. 12 illustrates a general-purpose computer system for executing the EDA software of the present invention.

FIG. 12 illustrates a general-purpose computer system for executing the EDA software for timing and power verification of the present invention. A computer system 1000 contains a processor unit 1005, main memory 1012, and an interconnect bus 1025. The processor unit 1005 may contain a single microprocessor, or may contain a plurality of microprocessors for configuring the computer system 1000 as a multi-processor system. The main memory 1012 stores, in part, instructions and data for execution by the processor unit 1005. The main memory 1012 may include banks of dynamic random access memory (DRAM) as well as high-speed cache memory.

The computer system 1000 further includes a mass storage device 1022, peripheral device(s) 1030, portable storage medium drive(s) 1040, input control device(s) 1070, a graphics subsystem 1050, and an output display 1060. For purposes of simplicity, all components in the computer system 1000 are shown in FIG. 12 as being connected via the bus 1025. However, the computer system 1000 may be connected through one or more data transport means. For example, the processor unit 1005 and the main memory 1012 may be connected via a local microprocessor bus, and the mass storage device 1022, peripheral device(s) 1030, portable storage medium drive(s) 1040, graphics subsystem 1050 may be connected via one or more input/output (I/O) busses. The mass storage device 1022, which may be implemented with a magnetic disk drive or an optical disk drive, is a non-volatile storage device for storing data and instructions for use by the processor unit 1005. In the software embodiment, the mass storage device 1022 stores the software for loading to the main memory 1012.

The portable storage medium drive 1040 operates in conjunction with a portable non-volatile storage medium, such as a floppy disk or a compact disc read only memory (CD-ROM), to input and output data and code to and from the computer system 1000. In one embodiment, the software is stored on such a portable medium, and is input to the computer system 1000 via the portable storage medium drive 1040. The peripheral device(s) 1030 may include any type of computer support device, such as an input/output (I/O) interface, to add additional functionality to the computer system 1000. For example, the peripheral device(s) 1030 may include a network interface card for interfacing the computer system 1000 to a network.

The input control device(s) 1070 provide a portion of the user interface for a user of the computer system 1000. The input control device(s) 1070 may include an alphanumeric keypad for inputting alphanumeric and other key information, a cursor control device, such as a mouse, a trackball, stylus, or cursor direction keys. In order to display textual and graphical information, the computer system 1000 contains the graphics subsystem 1050 and the output display 1060. The output display 1060 may include a cathode ray tube (CRT) display or liquid crystal display (LCD). The graphics subsystem 1050 receives textual and graphical information, and processes the information for output to the output display 1060. The components contained in the computer system 1000 are those typically found in general purpose computer systems, and in fact, these components are intended to represent a broad category of such computer components that are well known in the art.

For the software implementation, the EDA software includes a plurality of computer executable instructions for implementation on a general-purpose computer system. Prior to loading into a general-purpose computer system, the EDA software may reside as encoded information on a computer readable medium, such as a magnetic floppy disk, magnetic tape, and compact disc read only memory (CD-ROM). In one hardware implementation, the EDA software may comprise a dedicated processor including processor instructions for performing the functions described herein. Circuits may also be developed to perform the functions described herein.

Although the present invention has been described in terms of specific exemplary embodiments, it will be appreciated that various modifications and alterations might be made by those skilled in the art without departing from the spirit and scope of the invention.

What is claimed is:

1. A computer implemented method for determining timing delay for a circuit in an integrated circuit, said method comprising the steps of:

determining a resistive-capacitive ("RC") network between a driving point and a receiving point, said circuit driving said RC network at said driving point;

storing a circuit characterization model for said circuit, said circuit characterization model depicting relationships among input signal slew rate, load capacitance, current at said driving point and voltage at said driving point for said circuit;

determining a plurality of effective driving currents for said circuit at said driving point based on said circuit characterization model; and determining timing delay parameters from said effective driving currents.

2. The method as set forth in claim 1, wherein the step of determining a plurality of effective driving currents comprises the steps of:

selecting an initial drive current;

determining a drive voltage, corresponding to said drive current, by simulating the drive, at said driving point, of said RC network with said initial drive current;

determining an effective capacitance as a load for said circuit;

determining a new drive current for said circuit from said drive voltage and said effective capacitance; and repeating the steps of determining a drive voltage and determining an effective capacitance for said plurality of drive currents.

3. The method as set forth in claim 1, wherein the step of determining timing delay parameters from said effective driving currents comprises the steps of:

determining a voltage at said driving point from an impedance of said RC network and said driving currents;

determining a voltage at said receiving point from a transfer function of said RC network; and determining timing parameters for RC network propagation delay from said voltage at said driving point and said voltage at said receiving point.

4. The method as set forth in claim 1, wherein the step of determining timing delay parameters from said effective driving currents comprises the steps of:

receiving an input voltage to said circuit;

determining a voltage at said driving point from an impedance of said RC network and said driving currents; and determining timing parameters for driving instance delay of said circuit from said input voltage to said voltage at said driving point.

5. The method as set forth in claim 1, further comprising the steps of:

selecting a plurality of time instances corresponding to a plurality of output voltages to said circuit; and determining a plurality of effective driving currents for said circuit for each of said time instances.

6. The method as set forth in claim 2, wherein the step of determining an effective capacitance comprises the step of determining said effective capacitance based on charging and discharging of said RC network from said drive current.

7. The method as set forth in claim 2, wherein the step of determining a new drive current for said circuit from said drive voltage and said effective capacitance comprises the steps of:

selecting an input signal slew rate for simulation of an input signal to said circuit; and accessing said circuit characterization model to extract a drive current based on said drive voltage, effective capacitance, and said input signal slew rate selected.

8. The method as set forth in claim 1, wherein:

said integrated circuit comprises at least one standard cell;

said circuit comprises a gate level circuit implemented on said standard cell; and said RC network comprises an interconnect network on said integrated circuit for coupling said driving point to said receiving point.

9. The method as set forth in claim 1, further comprising the steps of:

selecting, from one of said plurality of drive currents, a drive current with the largest value as a peak current; and calculating peak power from said peak current.

10. A method for characterizing a circuit for determining a timing delay, said method comprising the step of:

determining a resistive-capacitive ("RC") network between a driving point and a receiving point, said circuit driving said RC network at said driving point;

selecting a plurality of time instances for analysis of said circuit;

determining a load capacitance for each of said time instances, said load capacitance specifying a capacitance from said driving point of said circuit;

determining operation of said circuit at a new time instance based on said load capacitance of a previous time instance and bases on an effective driving current at said driving point; and determining timing delay parameters based on said effective driving current to said RC network at said time instances.

11. The method as set forth in claim 10, wherein the step of determining operation of said circuit at a new time instance based on said load capacitance of a previous time instance comprises the steps of:

selecting an initial drive current;

determining a drive voltage, corresponding to said drive current, by simulating the drive, at said driving point, of said RC network with said initial drive current;

determining a new drive current for said circuit from said drive voltage and said load capacitance; and repeating the steps of determining a drive voltage from said load capacitance for said drive currents.

12. The method as set forth in claim 11, wherein the step of determining a new drive current for said circuit from said drive voltage and said load capacitance comprises the steps of:

storing a circuit characterization model for said circuit, said circuit characterization model depicting relationships among input signal slew rate, load capacitance, drive current and drive voltage for said circuit; and selecting an input signal slew rate for simulation of an input signal to said circuit; and accessing said circuit characterization model to extract a drive current based on said drive voltage, effective capacitance, and said input signal slew rate selected.

13. A computer readable medium, comprising a plurality of instructions, which when executed by a computer, causes the computer to determine timing delays for a circuit in an integrated circuit, said instructions for:

determining a resistive-capacitive ("RC") network between a driving point and a receiving point, said circuit driving said RC network at said driving point;

storing a circuit characterization model for said circuit, said circuit characterization model depicting relationships among input signal slew rate, load capacitance, current at said driving point and voltage at said driving point for said circuit;

determining a plurality of effective driving currents for said circuit at said driving point based on said circuit characterization model; and determining timing delay parameters from said effective driving currents.

14. The computer readable medium as set forth in claim 13, the instructions for determining a plurality of effective driving currents comprises instructions for:

selecting an initial drive current;

determining a drive voltage, corresponding to said drive current, by simulating the drive, at said driving point, of said RC network with said initial drive current;

determining an effective capacitance as a load for said circuit;

determining a new drive current for said circuit from said drive voltage and said effective capacitance; and repeating the steps of determining a drive voltage and determining an effective capacitance for said plurality of drive currents.

15. The computer readable medium as set forth in claim 13, wherein instructions for determining timing delay parameters from said effective driving currents comprises the steps of:

determining a voltage at said driving point from an impedance of said RC network and said driving currents;

determining a voltage at said receiving point from a transfer function of said RC network; and determining timing parameters for RC network propagation delay from said voltage at said driving point and said voltage at said receiving point.

16. The computer readable medium as set forth in claim 13, wherein instructions for determining timing delay parameters from said effective driving currents comprises instructions for:

receiving an input voltage to said circuit;

determining a voltage at said driving point from an impedance of said RC network and said driving currents; and determining timing parameters for driving instance delay of said circuit from said input voltage to said voltage at said driving point.

17. The computer readable medium as set forth in claim 13, further comprising instructions for:

selecting a plurality of time instances corresponding to a plurality of output voltages to said circuit; and determining a plurality of effective driving currents for said circuit for each of said time instances.

18. The computer readable medium as set forth in claim 14, wherein the instructions for determining an effective capacitance comprises instructions for determining said effective capacitance based on charging and discharging of said RC network from said drive current.

19. The computer readable medium as set forth in claim 14, wherein instructions for determining a new drive current for said circuit from said drive voltage and said effective capacitance comprises instructions for:

selecting an input signal slew rate for simulation of an input signal to said circuit; and accessing said circuit characterization model to extract a drive current based on said drive voltage, effective capacitance, and said input signal slew rate selected.

20. The computer readable medium as set forth in claim 14, wherein:

said integrated circuit comprises at least one standard cell;

said circuit comprises a gate level circuit implemented on said standard cell; and said RC network comprises an interconnect network on said integrated circuit for coupling said driving point to said receiving point.

21. The computer readable medium as set forth in claim 14, further comprising instructions for:

selecting, from one of said plurality of drive currents, a drive current with the largest value as a peak current; and calculating peak power from said peak current.

22. A computer readable medium, comprising a plurality of instructions, which when executed by a computer, causes the computer to determine timing delays for a circuit in an integrated circuit, said instructions for:

determining a resistive-capacitive ("RC") network between a driving point and a receiving point, said circuit driving said RC network at said driving point;

selecting a plurality of time instances for analysis of said circuit;

determining a load capacitance for each of said time instances, said load capacitance specifying a capacitance from said driving point of said circuit;

determining operation of said circuit at a new time instance based on said load capacitance of a previous time instance and based on an effective driving current at said driving point; and determining timing delay parameters based on said effective driving current to said RC network at said time instances.

23. The computer readable medium as set forth in claim 22, wherein instructions for determining operation of said circuit at a new time instance based on said load capacitance of a previous time instance comprises instructions for:

selecting an initial drive current;

determining a drive voltage, corresponding to said drive current, by simulating the drive, at said driving point, of said RC network with said initial drive current;

determining a new drive current for said circuit from said drive voltage and said load capacitance; and repeating the steps of determining a drive voltage from said load capacitance for said drive currents.

24. The computer readable medium as set forth in claim 23, wherein instructions for determining a new drive current for said circuit from said drive voltage and said load capacitance comprises instructions for:

storing a circuit characterization model for said circuit, said circuit characterization model depicting relationships among input signal slew rate, load capacitance, drive current and drive voltage for said circuit; and selecting an input signal slew rate for simulation of an input signal to said circuit; and accessing said circuit characterization model to extract a drive current based on said drive voltage, effective capacitance, and said input signal slew rate selected.

25. A computer implemented method for determining timing delay for a circuit in an integrated circuit, said method comprising the steps of:

determining a resistive-capacitive ("RC") network between a driving point and a receiving point, said circuit driving said RC network at said driving point;

storing a circuit characterization model for said circuit, said circuit characterization model depicting relationships among input signal slew rate, load capacitance, current at said driving point and voltage at said driving point for said circuit;

selecting a plurality of time instances;

selecting an initial drive current;

determining a drive voltage for each of said time instances, corresponding to said drive current, by simulating the drive, at said driving point, of said RC network with said initial drive current;

determining an effective capacitance for each of said time instances as a load for said circuit;

determining a new drive current for each of said time instances for said circuit from said drive voltage and said effective capacitance of a previous time instance;

repeating the steps of determining a drive voltage and determining an effective capacitance for said plurality of drive currents at each of said time instances;

determining a voltage at said receiving point from a transfer function of said RC network;

determining timing parameters for RC network propagation delay from said voltage at said driving point and said voltage at said receiving point;

receiving an input voltage to said circuit;

determining a voltage at said driving point from an impedance of said RC network and said driving currents; and determining timing parameters for driving instance delay of said circuit from said input voltage to said voltage at said driving point.

* * * * *

UNITED STATES PATENT AND TRADEMARK OFFICE
CERTIFICATE OF CORRECTION

PATENT NO. : 6,721,929 B2
DATED : April 13, 2004
INVENTOR(S) : Li et al.

It is certified that error appears in the above-identified patent and that said Letters Patent is hereby corrected as shown below:

Column 12,
Line 27, "and bases on an effective driving current" should read -- and based on an effective driving current --.

Signed and Sealed this

Twenty-first Day of December, 2004

JON W. DUDAS
*Director of the United States Patent and Trademark Office*